(12) United States Patent
Taniguchi

(10) Patent No.: US 10,601,390 B2
(45) Date of Patent: Mar. 24, 2020

(54) BALANCE FILTER

(71) Applicant: Murata Manufacturing Co., Ltd., Nagaokakyo-shi, Kyoto-fu (JP)

(72) Inventor: Tetsuo Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 90 days.

(21) Appl. No.: 15/951,207

(22) Filed: Apr. 12, 2018

(65) Prior Publication Data

US 2018/0234073 A1 Aug. 16, 2018

Related U.S. Application Data

(63) Continuation of application No. PCT/JP2016/077605, filed on Sep. 19, 2016.

(30) Foreign Application Priority Data

Oct. 21, 2015 (JP) ................... 2015-207576

(51) Int. Cl.
*H03H 7/42* (2006.01)
*H01P 5/10* (2006.01)
(Continued)

(52) U.S. Cl.
CPC ............. *H03H 7/422* (2013.01); *H01F 17/00* (2013.01); *H01F 27/00* (2013.01);
(Continued)

(58) Field of Classification Search
CPC ..................................... H03H 7/42; H01P 5/10
(Continued)

(56) References Cited

U.S. PATENT DOCUMENTS 6,850,127 B2 * 2/2005 Sakakura ............... H03H 7/09
333/185
7,327,131 B2 * 2/2008 Ezzeddine ............. H03H 7/42
323/355
(Continued)

FOREIGN PATENT DOCUMENTS

JP 2006-262239 A 9/2006
JP 2012-109949 A 6/2012
(Continued)

OTHER PUBLICATIONS

Official Communication issued in International Patent Application No. PCT/JP2016/077605, dated on Dec. 6, 2016.

*Primary Examiner* — Dean O Takaoka
(74) *Attorney, Agent, or Firm* — Keating & Bennett, LLP

(57) ABSTRACT

A small-sized balance filter includes an unbalanced terminal and two pairs of balanced terminals and has a low signal insertion loss. An unbalanced terminal, a first balanced terminal including first and second terminals, and a second balanced terminal Rx including first and second terminals are provided. An unbalanced-side inductor is provided between the unbalanced terminal and the ground, first balanced-side inductors are provided between the first and second terminals of the first balanced terminal, second balanced-side inductors are provided between the first and second terminals of the second balanced terminal, and the unbalanced-side inductor is electromagnetic-field-coupled to each of the first and second balanced-side inductors.

17 Claims, 5 Drawing Sheets

(51) Int. Cl.

| | | |
|---|---|---|
| *H01F 17/00* | (2006.01) | |
| *H03H 7/09* | (2006.01) | |
| *H01F 27/00* | (2006.01) | |
| *H03H 7/01* | (2006.01) | |
| *H03H 7/48* | (2006.01) | |
| *H03H 7/46* | (2006.01) | |
| *H04B 1/58* | (2006.01) | |
| *H03H 1/00* | (2006.01) | |
| *H03H 7/38* | (2006.01) | |

(52) U.S. Cl.
CPC ........ *H03H 7/0115* (2013.01); *H03H 7/0123* (2013.01); *H03H 7/09* (2013.01); *H03H 7/461* (2013.01); *H03H 7/482* (2013.01); *H04B 1/581* (2013.01); *H03H 7/38* (2013.01); *H03H 2001/0085* (2013.01)

(58) Field of Classification Search
USPC .................................. 333/4, 15, 26
See application file for complete search history.

(56) References Cited

U.S. PATENT DOCUMENTS

| | | | | |
|---|---|---|---|---|
| 7,683,851 | B2* | 3/2010 | Rofougaran | ............ H03F 3/211 343/850 |
| 7,859,359 | B2* | 12/2010 | Rofougaran | .............. H01P 5/10 333/101 |
| 7,924,112 | B2* | 4/2011 | Liu | ........................... H01P 5/10 333/238 |
| 7,994,873 | B2* | 8/2011 | Shyu | ....................... H03H 7/42 333/236 |
| 8,076,996 | B2* | 12/2011 | Lee | ........................ H03H 11/32 333/117 |
| 8,279,018 | B1 | 10/2012 | Song et al. | |
| 9,887,683 | B2* | 2/2018 | Kuribara | .................. H03H 7/42 |
| 2004/0182602 | A1* | 9/2004 | Satoh | .................. H01F 17/0006 174/258 |
| 2008/0224791 | A1 | 9/2008 | Cheng | |
| 2008/0266020 | A1 | 10/2008 | Nosaka | |
| 2009/0051459 | A1 | 2/2009 | Miyata et al. | |
| 2012/0013387 | A1 | 1/2012 | Sankaranarayanan et al. | |
| 2012/0098622 | A1 | 4/2012 | Taniguchi | |
| 2012/0098623 | A1* | 4/2012 | Taniguchi | ................. H01P 5/10 333/185 |
| 2012/0249262 | A1 | 10/2012 | Kim et al. | |
| 2013/0057343 | A1 | 3/2013 | Kondo | |
| 2013/0154768 | A1 | 6/2013 | Taniguchi | |
| 2014/0320374 | A1 | 10/2014 | Lai et al. | |

FOREIGN PATENT DOCUMENTS

| | | |
|---|---|---|
| JP | 2013-138410 A | 7/2013 |
| JP | 2013-535885 A | 9/2013 |
| WO | 2005/076404 A1 | 8/2005 |

* cited by examiner

FREQUENCY [0.5GHz to 1.5GHz]

FREQUENCY [0.5GHz to 1.5GHz]

BALANCE FILTER

CROSS REFERENCE TO RELATED APPLICATIONS

This application claims the benefit of priority to Japanese Patent Application No. 2015-207576 filed on Oct. 21, 2015 and is a Continuation Application of PCT Application No. PCT/JP2016/077605 filed on Sep. 19, 2016. The entire contents of each application are hereby incorporated herein by reference.

BACKGROUND OF THE INVENTION

1. Field of the Invention

The present invention relates to a balance filter, and more particularly, to a small-sized balance filter including an unbalanced terminal and two pairs of balanced terminals and having a low signal insertion loss.

2. Description of the Related Art

To reduce external impact of noise, an RF (Radio Frequency) circuit of a communication apparatus and a peripheral circuit thereof may use a balanced line as a signal line. For example, input of an Rx signal from an antenna to an RF circuit and output of a Tx signal from the RF circuit to the antenna may be performed using a balanced line.

In such a case, conventionally, for sharing of an antenna between transmission of a Tx signal and reception of an Rx signal, an unbalanced line from the antenna needs to be divided into two unbalanced lines by a divider so that, for example, a balance filter disclosed in Japanese Unexamined Patent Application Publication No. 2013-138410 is connected to each of the unbalanced lines, and each of the balance filters needs to be connected to an RF circuit using a balanced line.

FIG. 6 illustrates a balance filter (laminated balance filter) 200 disclosed in Japanese Unexamined Patent Application Publication No. 2013-138410. The balance filter 200 includes an unbalanced terminal UB and a balanced terminal B including a first terminal B1 and a second terminal B2. The balance filter 200 outputs an unbalanced signal, which has been input to the unbalanced terminal UB, from the balanced terminal B (the first terminal B1 and the second terminal B2) as a balanced signal, and outputs a balanced signal, which has been input to the balanced terminal B (the first terminal B1 and the second terminal B2), from the unbalanced terminal UB as an unbalanced signal. The balance filter 200 of Japanese Unexamined Patent Application Publication No. 2013-138410 is produced by forming an inductor electrode (inductor electrode pattern), a capacitor electrode (capacitor electrode pattern), a ground electrode (ground electrode pattern), a via electrode, and the like inside a multilayer body in which a plurality of dielectric layers are laminated. Furthermore, in the balance filter 200, a band pass filter including an LC parallel resonator is inserted between the unbalanced terminal UB and the balanced terminal B.

FIG. 7 illustrates an example of a balanced-unbalanced conversion circuit having a configuration in which a divider 300 is connected to two balance filters 200.

The divider 300 includes a first terminal 101, a second terminal 102, and a third terminal 103. In the divider 300, a signal input to the first terminal 101 is distributed and output from the second terminal 102 and the third terminal 103, and signals input to the second terminal 102 and the third terminal 103 are combined and output from the first terminal.

In the balanced-unbalanced conversion circuit, an antenna Ant and the first terminal 101 of the divider 300 are connected using an unbalanced line. Furthermore, the second terminal 102 of the divider 300 and the unbalanced terminal UB of one of the balance filters 200 are connected using an unbalanced line, and the third terminal 103 of the divider 300 and the unbalanced terminal UB of the other balance filter 200 are connected using an unbalanced line. Moreover, a balanced line on a Tx side is connected to the balanced terminal B (the first terminal B1 and the second terminal B2) of the one of the balance filters 200, and a balanced line on an Rx side is connected to the balanced terminal B (the first terminal B1 and the second terminal B2) of the other balance filter 200.

As with the balanced-unbalanced conversion circuit illustrated in FIG. 7, output of a Tx signal from the RF circuit and input of an Rx signal to the RF signal are performed using balanced lines, and the antenna Ant is shared between transmission of the Tx signal and reception of the Rx signal. Therefore, a known method using the divider 300 and the two balance filters 200 has the problems described below.

First, a signal line connected to the antenna Ant is divided by the divider 300, and therefore, there is a problem in which insertion loss occurs in a signal. For example, an Rx signal transmitted from the antenna Ant to the RF circuit passes through the divider, thus being attenuated by about 3 dB. Furthermore, insertion loss also occurs in each of the balance filters 200, and therefore, there is a problem in which the total insertion loss increases.

Furthermore, there is a need to use the divider 300 and the two balance filters 200, and a large number of components is thus required. Therefore, a large mounting space is required inside the communication apparatus, and there is a problem in which the size of a communication apparatus increases. Moreover, there is a problem in which manufacturing is complicated due to a large number of components.

SUMMARY OF THE INVENTION

Preferred embodiments of the present invention provide balance filters including an unbalanced terminal, a first balanced terminal including a first terminal and a second terminal, and a second balanced terminal including a first terminal and a second terminal. An unbalanced-side inductor is provided between the unbalanced terminal and a ground. A first balanced-side inductor is provided between the first terminal and the second terminal of the first balanced terminal. A second balanced-side inductor is provided between the first terminal and the second terminal of the second balanced terminal. The unbalanced-side inductor is electromagnetic-field-coupled to each of the first balanced-side inductor and the second balanced-side inductor.

Preferably, a low pass filter is provided between the unbalanced terminal and the unbalanced-side inductor, the low pass filter includes a first inductor, a first capacitor provided between one end of the first inductor and the ground, and a second capacitor provided between the other end of the first inductor and the ground, and the unbalanced-side inductor is connected in parallel with the second capacitor. In this case, with the low pass filter, a frequency band of a signal passing through between the unbalanced terminal and the first balanced terminal and a frequency band of a signal passing through between the unbalanced terminal and the second balanced terminal may be adjusted.

Furthermore, separately, the unbalanced-side inductor and the second capacitor that are connected in parallel define an LC parallel resonator. A function of the LC parallel resonator will be described later.

In this case, it is preferable that a third capacitor is connected in parallel with the first inductor of the low pass filter. In this case, a trap may be provided on a higher frequency side outside a pass band of the low pass filter, and the function of the low pass filter is thus improved.

Preferably, a fourth capacitor is further provided between the first terminal and the second terminal of the first balanced terminal, and a fifth capacitor is further provided between the first terminal and the second terminal of the second balanced terminal. In this case, the first balanced-side inductor and the fourth capacitor define an LC parallel resonator. Furthermore, the second balanced-side inductor and the fifth capacitor define an LC parallel resonator. The LC parallel resonator including the first balanced-side inductor and the fourth capacitor defines, in cooperation with the above-described LC parallel resonator including the unbalanced-side inductor and the second capacitor, if the LC parallel resonator including the unbalanced-side inductor and the second capacitor is provided, or individually defines, if the second capacitor is omitted and the LC parallel resonator including the second capacitor is not provided, a first band pass filter. The first band pass filter allows only signals within a frequency band that is selected to pass through between the unbalanced terminal and the first balanced terminal. Furthermore, the LC parallel resonator including the second balanced-side inductor and the fifth capacitor defines, in cooperation with the above-described LC parallel resonator including the unbalanced-side inductor and the second capacitor, if the LC parallel resonator including the unbalanced-side inductor and the second capacitor is provided, or individually defines, if the second capacitor is omitted and the LC parallel resonator including the second capacitor is not provided, a second band pass filter. The second band pass filter allows only signals within a frequency band that is selected to pass through between the unbalanced terminal and the second balanced terminal. Even in the case in which the fourth capacitor and the fifth capacitor are not provided, the LC parallel resonator including the unbalanced-side inductor and the second capacitor defines and functions as a band pass filter or a portion of a band pass filter.

Preferably, the first balanced-side inductor includes a first inductor unit, a second inductor unit, and a third inductor unit that are connected in series in this order, the unbalanced-side inductor is electromagnetic-field-coupled primarily to the second inductor unit of the first balanced-side inductor, the second balanced-side inductor includes a first inductor unit, a second inductor unit, and a third inductor unit that are connected in series in this order, and the unbalanced-side inductor is electromagnetic-field-coupled primarily to the second inductor unit of the second balanced-side inductor. In this case, the strength of the electromagnetic coupling between the unbalanced-side inductor and the first balanced-side inductor is able to be easily adjusted, and the strength of the electromagnetic coupling between the unbalanced-side inductor and the second balanced-side inductor is able to be easily adjusted. That is, for each of the first balanced-side inductor and the second balanced-side inductor, the second inductor unit is primarily used to adjust the electromagnetic coupling with the unbalanced-side inductor. In contrast, for each of the first balanced-side inductor and the second balanced-side inductor, the first inductor unit and the third inductor unit are primarily used to adjust impedance of the first balanced terminal or the second balanced terminal.

Preferably, a DC feed terminal is connected to a middle portion of the first balanced-side inductor. In this case, by supplying DC power to the DC feed terminal, for example, the strength of a Tx signal transmitted from an antenna is able to be increased.

Preferably, an impedance of the first balanced terminal is different from an impedance of the second balanced terminal. In this case, for example, even if the impedances on the Rx side and Tx side of a connected RF circuit are different from each other, the balance filter according to a preferred embodiment of the present invention may be directly connected. Furthermore, the impedance of the first balanced terminal and the impedance of the second balanced terminal is able to be designed independently.

Furthermore, a frequency of a pass band between the unbalanced terminal and the first balanced terminal may be different from a frequency of a pass band between the unbalanced terminal and the second balanced terminal.

Alternatively, a frequency of a pass band between the unbalanced terminal and the first balanced terminal may be the same or substantially the same as a frequency of a pass band between the unbalanced terminal and the second balanced terminal. In this case, for example, a balance filter according to a preferred embodiment of the present invention may be used for communication of, for example, a TDD (Time Division Duplex) system.

Preferably, a balance filter according to a preferred embodiment of the present invention includes a multilayer body in which a plurality of dielectric layers are laminated, a plurality of inductor electrodes that are laminated between the dielectric layers, and a plurality of via electrodes that penetrate through the dielectric layers, and each of the unbalanced-side inductor, the first balanced-side inductor, and the second balanced-side inductor is defined by the inductor electrode or by the inductor electrode and the via electrode.

Furthermore, preferably, the balance filter further includes a plurality of capacitor electrodes that are laminated between the dielectric layers, and at least one of the first capacitor, the second capacitor, the third capacitor, the fourth capacitor, and the fifth capacitor is defined by a capacitance produced between the plurality of capacitor electrodes.

Preferably, inside the multilayer body, the inductor electrode defining the unbalanced-side inductor includes at least a lower inductor electrode and an upper inductor electrode that are divided, and the lower inductor electrode and the upper inductor electrode are connected by the via electrode. In this case, in a direction in which the dielectric layers are laminated, the inductor electrode defining the second inductor unit of the first balanced-side inductor and the inductor electrode defining the second inductor unit of the second balanced-side inductor may be sandwiched between the lower inductor electrode and the upper inductor electrode of the unbalanced-side inductor. In this case, the unbalanced-side inductor and the first balanced-side inductor may be electromagnetic-field-coupled to each other, and at the same time, the unbalanced-side inductor and the second balanced-side inductor may be electromagnetic-field-coupled to each other. Furthermore, by adding an inductor electrode including an unbalanced-side inductor to a location below the lower inductor electrode and/or above the upper inductor electrode, the strength of the electromagnetic coupling is able to be increased.

In the above configuration, preferably, each of the inductor electrode defining the first balanced-side inductor and the inductor electrode defining the second balanced-side inductor has a ring shape, and the via electrode that provides connection between the lower inductor electrode and the upper inductor electrode of the unbalanced-side inductor penetrates through inside the ring shape of the inductor electrode of the second inductor unit of the first balanced-side inductor and inside the ring shape of the inductor electrode of the second inductor unit of the second balanced-side inductor. In this case, a magnetic flux produced by a via electrode that provides connection between the lower inductor electrode and the upper inductor electrode of the unbalanced-side inductor and a magnetic flux produced by the inductor electrode of the second inductor unit of the first balanced-side inductor are orthogonal or substantially orthogonal to each other, and the interference with each other is thus able to be reduced or prevented. Therefore, a reduction in Q of both of the unbalanced-side inductor and the first balanced-side inductor is able to be reduced or prevented. Furthermore, a magnetic flux produced by a via electrode that provides connection between the lower inductor electrode and the upper inductor electrode of the unbalanced-side inductor and a magnetic flux produced by the inductor electrode of the second inductor unit of the second balanced-side inductor are orthogonal or substantially orthogonal to each other, and the interference with each other may thus be reduced or prevented. Therefore, a reduction in Q of both of the unbalanced-side inductor and the second balanced-side inductor is able to be reduced or prevented.

Balance filters according to preferred embodiments of the present invention each include an unbalanced terminal and two pairs of balanced terminals. However, no divider is used. Therefore, there is no insertion loss of a signal caused by passing through the divider, and the total insertion loss is low.

Furthermore, balance filters according to preferred embodiments of the present invention achieve, with one balance filter, a function conventionally achieved by using a divider and two balance filters. The number of components is reduced, and miniaturization is able to be achieved. Therefore, for communication apparatuses in which balance filters according to preferred embodiments of the present invention are mounted, a required mounting space is able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
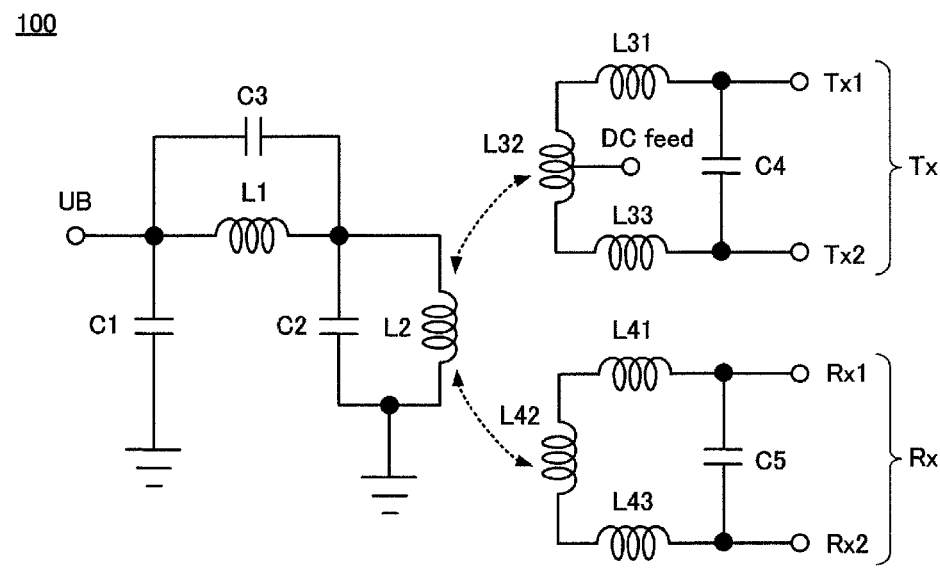
FIG. 1 is an equivalent circuit diagram of a balance filter 100 according to a preferred embodiment of the present invention.

Hereinafter, preferred embodiments of the present invention will be described with reference to drawings.

Individual preferred embodiments illustratively represent preferred embodiments of the present invention, and therefore, the present invention is not limited to the contents of the preferred embodiments. Furthermore, contents described in different preferred embodiments may be combined and implemented, and contents of such implementation are also included in the present invention. Drawings are intended to aid understanding of the preferred embodiments and are not necessarily rendered strictly. For example, rendered components or the ratio of dimensions of the components may not be the same or substantially the same as the ratio of dimensions of those described herein. Furthermore, components described herein may be omitted in the drawings or the number of components described herein may be reduced in the drawings.

Figure 2:
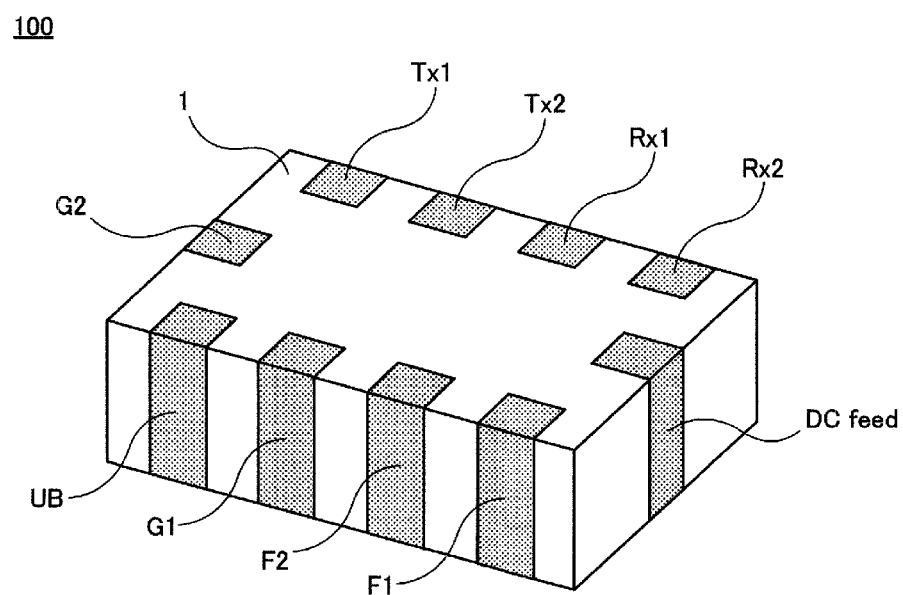
FIG. 2 is a perspective view of the balance filter 100.
Figure 3:
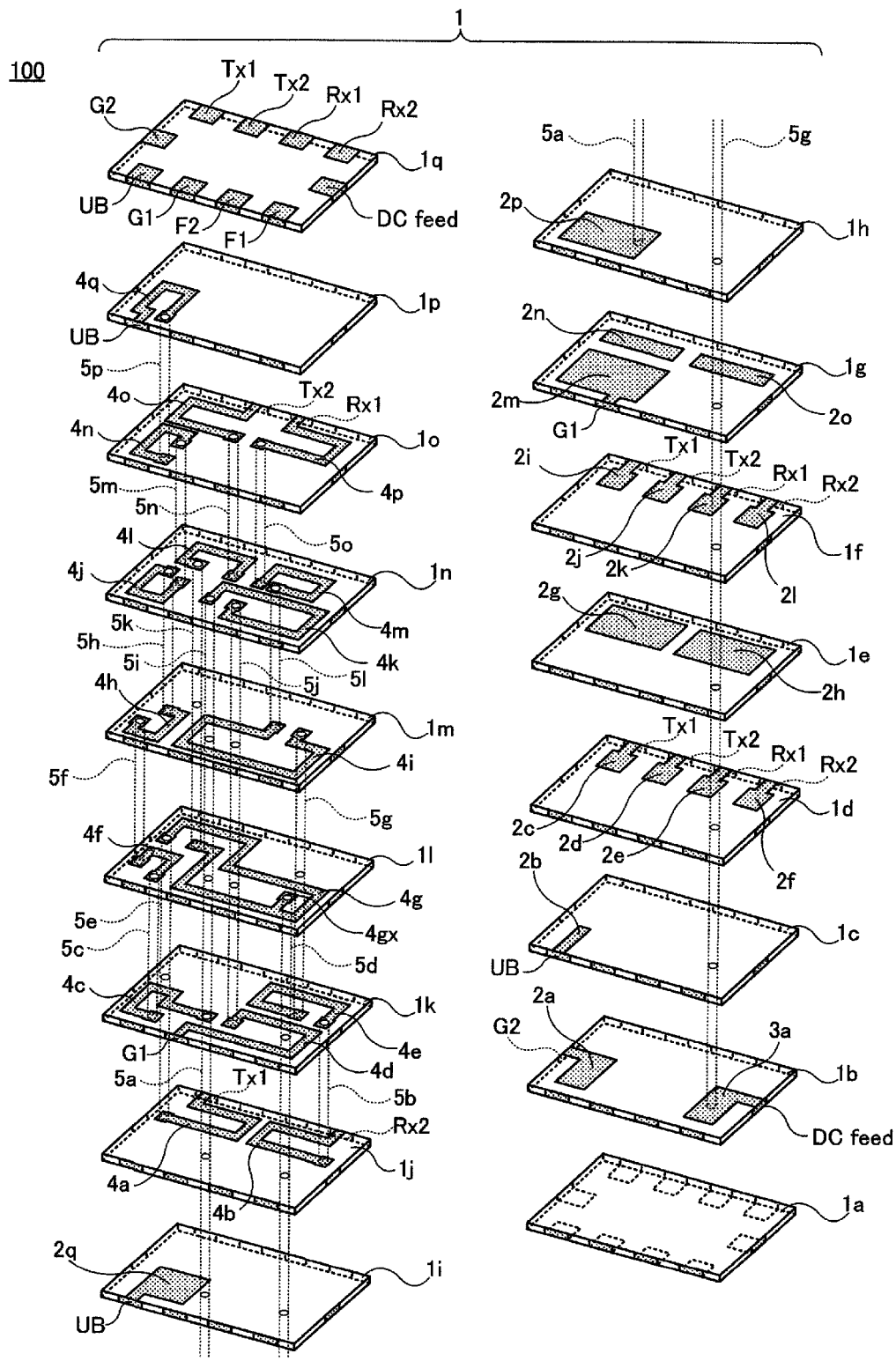
FIG. 3 is an exploded perspective view of the balance filter 100.

FIGS. 1 to 3 illustrate a balance filter 100 according to a preferred embodiment of the present invention. FIG. 1 is an equivalent circuit diagram of the balance filter 100. FIG. 2 is a perspective view in a case in which the balance filter 100 is defined by a multilayer body in which a plurality of dielectric layers are laminated. FIG. 3 is an exploded perspective view in a case in which the balance filter 100 is defined by a multilayer body in which a plurality of dielectric layers are laminated.

First, an equivalent circuit of the balance filter 100 will be described with reference to FIG. 1.

The balance filter 100 includes an unbalanced terminal UB.

The balance filter 100 also includes a first balanced terminal Tx including a first terminal Tx1 and a second terminal Tx2 and a second balanced terminal Rx including a first terminal Rx1 and a second terminal Rx2. In the present preferred embodiment, for the sake of convenience, two pairs of balanced terminals are represented by the first balanced terminal Tx and the second balanced terminal Rx. However, a use of each of the balanced terminals is determined in a desired manner. A first balanced terminal is not necessarily used as a Tx terminal, and a second balanced terminal is not necessarily used as an Rx terminal.

The balance filter 100 includes a low pass filter. The low pass filter includes a first inductor L1, a first capacitor C1 that is provided between one end of the first inductor L1 and the ground, and a second capacitor C2 that is provided between the other end of the first inductor L1 and the ground. The one end of the first inductor L1 (one end of the first capacitor C1) is connected to the unbalanced terminal UB. With this low pass filter, only signals within a frequency band that is selected are able to pass through the balance filter 100.

In the present preferred embodiment, a π low pass filter, for example, is preferably used as the low pass filter. However, the type of the low pass filter is not limited to the π low pass filter. A low pass filter of another type may be used.

In the balance filter 100, a third capacitor C3 is connected in parallel with the first inductor L1 of the low pass filter. The third capacitor C3 defines a trap on a higher frequency side outside a pass band of the low pass filter and improves functions and operation of the low pass filter.

The balance filter 100 includes an unbalanced-side inductor L2. The unbalanced-side inductor L2 is connected in parallel with the second capacitor C2 of the low pass filter. The unbalanced-side inductor L2 and the second capacitor C2, which are connected in parallel, define an LC parallel resonator.

The balance filter 100 includes a first balanced-side inductor in which a first inductor unit L31, a second inductor unit L32, and a third inductor unit L33 are connected in series. The first balanced-side inductor is connected between the first terminal Tx1 and the second terminal Tx2 of the first balanced terminal Tx. In the present preferred embodiment, a DC feed terminal DC feed is connected at a middle portion of the second inductor unit L32.

The balance filter 100 also includes a second balanced-side inductor in which a first inductor unit L41, a second inductor unit L42, and a third inductor unit L43 are connected in series. The second balanced-side inductor is connected between the first terminal Rx1 and the second terminal Rx2 of the second balanced terminal Rx.

In the balance filter 100, the unbalanced-side inductor L2 is electromagnetic-field-coupled to the first balanced-side inductor. The unbalanced-side inductor L2 is electromagnetic-field-coupled primarily to the second inductor unit L32 of the first balanced-side inductor.

Furthermore, in the balance filter 100, the unbalanced-side inductor L2 is electromagnetic-field-coupled to the second balanced-side inductor. The unbalanced-side inductor L2 is electromagnetic-field-coupled primarily to the second inductor unit L42 of the second balanced-side inductor.

In the balance filter 100, a fourth capacitor C4 is also provided between the first terminal Tx1 and the second terminal Tx2 of the first balanced terminal Tx.

The fourth capacitor C4 and the first balanced-side inductor (L31, L32, and L33) define an LC parallel resonator, which defines a first band pass filter, in cooperation with the LC parallel resonator including the unbalanced-side inductor L2 and the second capacitor C2. The first band pass filter allows only signals within a frequency band that is selected to pass through between the unbalanced terminal UB and the first balanced terminal Tx.

In the balance filter 100, the impedance on the first balanced terminal Tx (Tx1 and Tx2) side may be adjusted by selecting constants of the first balanced-side inductor (L31, L32, and L33) and the fourth capacitor C4.

In the balance filter 100, a fifth capacitor C5 is also provided between the first terminal Rx1 and the second terminal Rx2 of the second balanced terminal Rx. The fifth capacitor C5 and the second balanced-side inductor (L41, L42, and L43) define an LC parallel resonator, which defines a second band pass filter, in cooperation with the LC parallel resonator including the unbalanced-side inductor L2 and the second capacitor C2. The second band pass filter allows only signals within a frequency band that is selected to pass through between the unbalanced terminal UB and the second balanced terminal Rx.

In the balance filter 100, the impedance on the second balanced terminal Rx (Rx1 and Rx2) side may be adjusted by selecting constants of the second balanced-side inductor (L41, L42, and L43) and the fifth capacitor C5.

The balance filter 100 including the equivalent circuits described above allows a balanced signal that has been input to the first balanced terminal Tx to be output from the unbalanced terminal UB as an unbalanced signal. The strength of the unbalanced signal output from the unbalanced terminal UB may be increased by supplying DC power to the DC feed terminal DC feed. Furthermore, an unbalanced signal input to the unbalanced terminal UB may be output from the second balanced terminal Rx as a balanced signal.

Balanced signals having phases that are different by about 180 degrees and having the same or substantially the same amplitudes are input to the first terminal Tx1 and the second terminal Tx2 of the first balanced terminal Tx. Furthermore, balanced signals having phases that are different by about 180 degrees and having the same or substantially the same amplitudes are output from the first terminal Rx1 and the second terminal Rx2 of the second balanced terminal Rx.

The balance filter 100 including the equivalent circuits described above may preferably be defined by, for example, a multilayer body 1 illustrated in FIGS. 2 and 3.

The multilayer body 1 includes dielectric layers 1a to 1q preferably made of, for example, ceramics that are laminated in order from the bottom.

As illustrated in FIG. 2, the unbalanced terminal UB, the first terminal Tx1 and the second terminal Tx2 of the first balanced terminal Tx, the first terminal Rx1 and the second terminal Rx2 of the second balanced terminal Rx, a first ground terminal G1, a second ground terminal G2, the DC feed terminal DC feed, a first floating terminal F1, and a second floating terminal F2 are provided on a surface of the multilayer body 1. Specifically, the first floating terminal F1, the second floating terminal F2, the first ground terminal G1, and the unbalanced terminal UB are provided in order, when viewed in a clockwise direction, on a side surface on the front side of the multilayer body 1 in FIG. 2. The second ground terminal G2 is provided on a left side surface of the multilayer body 1 in FIG. 2. The first terminal Tx1 of the first balanced terminal Tx, the second terminal Tx2 of the first balanced terminal Tx, the first terminal Rx1 of the second balanced terminal Rx, and the second terminal Rx2 of the second balanced terminal Rx are provided in order, when viewed in a clockwise direction, on a side surface on the back side of the multilayer body 1 in FIG. 2. The DC feed terminal DC feed is provided on a right side surface of the multilayer body 1 in FIG. 2. Both ends of each terminal extend onto a lower main surface and an upper main surface of the multilayer body 1.

The first floating terminal F1 and the second floating terminal F2 are not connected to a circuit inside the multilayer body 1. The first floating terminal F1 and the second floating terminal F2 are connected to a land electrode, such as a substrate, when the balance filter 100 is mounted and are used to increase the mounting strength.

The unbalanced terminal UB, the first terminal Tx1 and the second terminal Tx2 of the first balanced terminal Tx, the first terminal Rx1 and the second terminal Rx2 of the second balanced terminal Rx, the first ground terminal G1, the second ground terminal G2, the DC feed terminal DC feed, the first floating terminal F1, and the second floating terminal F2 may preferably each be made of, for example, Ag, Cu, or metal including an alloy of Ag, Cu, and other suitable materials as a main component. One or a plurality of plated layers including Ni, Sn, Au, or other suitable material as a main component may preferably be provided, according to need, on a surface of the terminals.

As illustrated in FIG. 3, capacitor electrodes 2a to 2q, a connection electrode 3a, and inductor electrodes 4a to 4q are provided between the dielectric layers 1a to 1q of the multilayer body 1. Furthermore, via electrodes 5a to 5p extend in a direction in which the dielectric layers 1a to 1q are laminated inside the multilayer body 1.

Specifically, the capacitor electrode 2a and the connection electrode 3a are provided on an upper main surface of the dielectric layer 1b. The capacitor electrode 2a is connected to the second ground terminal G2. Furthermore, the connection electrode 3a is connected to the DC feed terminal DC feed.

The capacitor electrode 2b is provided on an upper main surface of the dielectric layer 1c. The capacitor electrode 2b is connected to the unbalanced terminal UB.

The four capacitor electrodes 2c, 2d, 2e, and 2f are provided on an upper main surface of the dielectric layer 1d. The capacitor electrode 2c is connected to the first terminal Tx1 of the first balanced terminal Tx, the capacitor electrode 2d is connected to the second terminal Tx2 of the first balanced terminal Tx, the capacitor electrode 2e is connected to the first terminal Rx1 of the second balanced terminal Rx, and the capacitor electrode 2f is connected to the second terminal Rx2 of the second balanced terminal Rx.

The two capacitor electrodes 2g and 2h are provided on an upper main surface of the dielectric layer 1e.

The four capacitor electrodes 2i, 2j, 2k, and 2l are provided on an upper main surface of the dielectric layer 1f. The capacitor electrode 2i is connected to the first terminal Tx1 of the first balanced terminal Tx, the capacitor electrode 2j is connected to the second terminal Tx2 of the first balanced terminal Tx, the capacitor electrode 2k is connected to the first terminal Rx1 of the second balanced terminal Rx, and the capacitor electrode 2l is connected to the second terminal Rx2 of the second balanced terminal Rx.

The three capacitor electrodes 2m, 2n, and 2o are provided on an upper main surface of the dielectric layer 1g. The capacitor electrode 2m is connected to the first ground terminal G1.

The capacitor electrode 2p is provided on an upper main surface of the dielectric layer 1h.

The capacitor 2q is provided on an upper main surface of the dielectric layer 1i. The capacitor electrode 2q is connected to the unbalanced terminal UB.

The two inductor electrodes 4a and 4b are provided on an upper main surface of the dielectric layer 1j. One end of the inductor electrode 4a is connected to the first terminal Tx1 of the first balanced terminal Tx, and one end of the inductor electrode 4b is connected to the second terminal Rx2 of the second balanced terminal Rx.

The three inductor electrodes 4c, 4d, and 4e are provided on an upper main surface of the dielectric layer 1k. One end of the inductor electrode 4d is connected to the first ground terminal G1.

The two inductor electrodes 4f and 4g are provided on an upper main surface of the dielectric layer 1l. A middle section 4gx is provided at a middle portion of the inductor electrode 4g.

The two inductor electrodes 4h and 4i are provided on an upper main surface of the dielectric layer 1m.

The four inductor electrodes 4j, 4k, 4l, and 4m are provided on an upper main surface of the dielectric layer 1n.

The three inductor electrodes 4n, 4o, and 4p are provided on an upper main surface of the dielectric layer 1o. One end of the inductor electrode 4o is connected to the second terminal Tx2 of the first balanced terminal Tx, and one end of the inductor electrode 4o is connected to the first terminal Rx1 of the second balanced terminal Rx.

The inductor electrode 4q is provided on an upper main surface of the dielectric layer 1p. One end of the inductor electrode 4q is connected to the unbalanced terminal UB.

Inside the multilayer body 1, the via electrode 5a provides connection between the capacitor electrode 2p and one end of the inductor electrode 4c. The via electrode 5a is provided in connection with the via electrode 5i, which will be described later, in an integrated manner. For convenience of explanation of the connection relationship, however, a lower portion of this via electrode is represented by sign 5a, and an upper portion of this via electrode is represented by sign 5i.

The via electrode 5b provides connection between the other end of the inductor electrode 4b and one end of the inductor electrode 4e.

The via electrode 5c provides connection between the other end of the inductor electrode 4c and one end of the inductor electrode 4f.

The via electrode 5d provides connection between the connection electrode 3a and the middle section 4gx of the inductor electrode 4g.

The via electrode 5e provides connection between the other end of the inductor electrode 4a and one end of the inductor electrode 4g.

The via electrode 5f provides connection between the other end of the inductor electrode 4f and one end of the inductor electrode 4h.

The via electrode 5g provided connection between the other end of the inductor electrode 4e and one end of the inductor electrode 4i.

The via electrode 5h provides connection between the other end of the inductor electrode 4h and one end of the inductor electrode 4j.

The via electrode 5i provides connection between one end of the inductor electrode 4c and one end of the inductor electrode 4k.

The via electrode 5j provides connection between the other end of the inductor electrode 4d and the other end of the inductor electrode 4k.

The via electrode 5k provides connection between the other end of the inductor electrode 4g and one end of the inductor electrode 4l.

The via electrode 5l provides connection between the other end of the inductor electrode 4i and one end of the inductor electrode 4m.

The via electrode 5m provides connection between the other end of the inductor electrode 4j and one end of the inductor electrode 4n.

The via electrode 5n provides connection between the other end of the inductor electrode 4l and the other end of the inductor electrode 4o.

The via electrode 5o provides connection between the other end of the inductor electrode 4m and the other end of the inductor electrode 4p.

The via electrode 5p provides connection between the other end of the inductor electrode 4n and the other end of the inductor electrode 4q.

The capacitor electrodes 2a to 2q, the connection electrode 3a, the inductor electrodes 4a to 4q, and the via electrodes 5a to 5n that are described above may preferably be made of, for example, Ag, Cu, or metal including an alloy of Ag, Cu, and other suitable materials as a main component.

The balance filter 100 according to the present preferred embodiment having the configuration described above including a multilayer body in which a plurality of dielectric layers are laminated may be manufactured by a manufacturing method that has been conventionally used to manufacture a balance filter including a multilayer body.

Next, the relationship of an equivalent circuit of the balance filter 100 and a configuration inside the multilayer body 1 will be explained by comparing FIG. 1 with FIG. 3.

A low pass filter includes the first inductor L1, the first capacitor C1, and the second capacitor C2. The first inductor L1 is defined by a line starting from the unbalanced terminal UB, passing through the inductor electrode 4q, the via electrode 5p, the inductor electrode 4n, the via electrode 5m, the inductor electrode 4j, the via electrode 5h, the inductor electrode 4h, the via electrode 5f, the inductor electrode 4f, the via electrode 5c, and the inductor electrode 4c, and ending at the one end of the inductor electrode 4c.

The first capacitor C1 of the low pass filter is defined by a capacitance produced between the capacitor electrode 2b connected to the unbalanced terminal UB and the capacitor electrode 2a connected to the second ground terminal G2.

The second capacitor C2 of the low pass filter is defined by a capacitance produced between the capacitor electrode 2p connected to the one end of the inductor electrode 4c, which is the ending point of the first inductor L1, by the via electrode 5a and the capacitor electrode 2m connected to the first ground terminal G1.

Furthermore, the third capacitor C3 connected in parallel with the first inductor L1 of the low pass filter is defined by a capacitance produced between the capacitor electrode 2q connected to the unbalanced terminal UB and the capacitor electrode 2p connected to the one end of the inductor electrode 4c, which is the ending point of the first inductor L1, by the via electrode 5a.

The unbalanced-side inductor L2 is defined by a line starting from the one end of the inductor electrode 4c, which is the ending point of the first inductor L1, passing through the via electrode 5i, the inductor electrode 4k, the via electrode 5j, and the inductor electrode 4d, and ending at the first ground terminal G1.

In the unbalanced-side inductor L2, the inductor electrode 4d corresponds to a lower inductor electrode and the inductor electrode 4k corresponds to an upper inductor electrode. The inductor electrode 4d as the lower inductor electrode and the inductor electrode 4k as the upper inductor electrode are connected by the via electrode 5j.

The first balanced-side inductor is defined by a line starting from the first terminal Tx1 of the first balanced terminal Tx, passing through the inductor electrode 4a, the via electrode 5e, the inductor electrode 4g, the via electrode 5k, the inductor electrode 4l, the via electrode 5n, and the inductor electrode 4o, and ending at the second terminal Tx2 of the first balanced terminal Tx. The inductor electrode 4a and the via electrode 5e primarily define the first inductor unit L31 of the first balanced-side inductor. Furthermore, the inductor electrode 4g primarily defines the second inductor unit L32 of the first balanced-side inductor. The via electrode 5k, the inductor electrode 4l, the via electrode 5n, and the inductor electrode 4o primarily define the third inductor unit L33 of the first balanced-side inductor.

The middle section 4gx of the second inductor unit L32 of the first balanced-side inductor is connected to the DC feed terminal DC feed with the via electrode 5d and the connection electrode 3a interposed therebetween.

The second balanced-side inductor is defined by a line starting from the first terminal Rx1 of the second balanced terminal Rx, passing through the inductor electrode 4p, the via electrode 5o, the inductor electrode 4m, the via electrode 5l, the inductor electrode 4i, the via electrode 5g, the inductor electrode 4e, the via electrode 5b, and the inductor electrode 4b, and ending at the second terminal Rx2 of the second balanced terminal Rx. The inductor electrode 4p, the via electrode 5o, the inductor electrode 4m, and the via electrode 5l primarily define the first inductor unit L41 of the second balanced-side inductor. Furthermore, the inductor electrode 4i primarily defines the second inductor unit L42 of the second balanced-side inductor. The via electrode 5g, the inductor electrode 4e, the via electrode 5b, and the inductor electrode 4b define the third inductor unit L43 of the second balanced-side inductor.

The fourth capacitor C4 is primarily defined by a capacitance produced between the capacitor electrodes 2c and 2i connected to the first terminal Tx1 of the first balanced terminal Tx and the capacitor electrodes 2d and 2j connected to the second terminal Tx2 of the first balanced terminal Tx, with the capacitor electrodes 2g and 2n, which define and function as floating electrodes without being connected to any terminal, interposed therebetween.

The fifth capacitor C5 is primarily defined by a capacitance produced between the capacitor electrodes 2e and 2k connected to the first terminal Rx1 of the second balanced terminal Rx and the capacitor electrodes 2f and 2l connected to the second terminal Rx2 of the second balanced terminal Rx, with the capacitor electrodes 2h and 2o, which define and function as floating electrodes without being connected to any terminal, interposed therebetween.

In the balance filter 100 according to the present preferred embodiment having the equivalent circuit and configuration described above, the inductor electrode 4g of the second inductor unit L32 of the first balanced-side inductor and the inductor electrode 4i of the second inductor unit L42 of the second balanced-side inductor are sandwiched between the inductor electrode 4d defining the lower inductor electrode and the inductor electrode 4k defining the upper inductor electrode, the lower inductor electrode and the upper inductor electrode being obtained by dividing the unbalanced-side inductor L2 into two sections, in the direction in which the dielectric layers 1a to 1q are laminated.

Accordingly, at the time when the balance filter 100 is used, the unbalanced-side inductor L2 is electromagnetic-field-coupled to the second inductor unit L32 of the first balanced-side inductor. Furthermore, the unbalanced-side inductor L2 is electromagnetic-field-coupled to the second inductor unit L42 of the second balanced-side inductor.

Furthermore, in the balance filter 100 according to the present preferred embodiment, the inductor electrode 4g of the second inductor unit L32 of the first balanced-side inductor preferably has a ring shape, the inductor electrode 4i of the second inductor unit L42 of the second balanced-side inductor preferably has a ring shape, and the via electrode 5j that provides connection between the inductor electrode 4d defining the lower inductor electrode and the inductor electrode 4k defining the upper inductor electrode, the lower inductor electrode and the upper inductor electrode being obtained by dividing the unbalanced-side inductor L2 into two sections, and the via electrode 5i, penetrate through inside the ring-shaped portion of the inductor electrode 4g and inside the ring-shaped portion of the inductor electrode 4i.

Accordingly, in the balance filter 100, a magnetic flux produced by the via electrode 5j that provides connection between the inductor electrode 4d defining the lower inductor electrode of the unbalanced-side inductor L2 and the inductor electrode 4k defining the upper inductor electrode of the unbalanced-side inductor L2 and a magnetic flux produced by the inductor electrode 4g of the second inductor unit L32 of the first balanced-side inductor are orthogonal or substantially orthogonal to each other, and interference with each other is effectively reduced. Therefore, a reduction in Q is able to be reduced or prevented in both of the unbalanced-side inductor L2 and the first balanced-side inductor (second inductor unit L32). Furthermore, a magnetic flux produced by the via electrode 5j that provides connection between the inductor electrode 4d defining the lower inductor electrode of the unbalanced-side inductor L2 and the inductor electrode 4k defining the upper inductor electrode of the unbalanced-side inductor L2 and a magnetic flux produced by the inductor electrode 4i of the second inductor unit L42 of the second balanced-side inductor are orthogonal or substantially orthogonal to each other, and interference with each other is able to be reduced. Therefore, a reduction in Q is able to be reduced or prevented in both of the unbalanced-side inductor L2 and the second balanced-side inductor (second inductor unit L42).

Figure 4A:
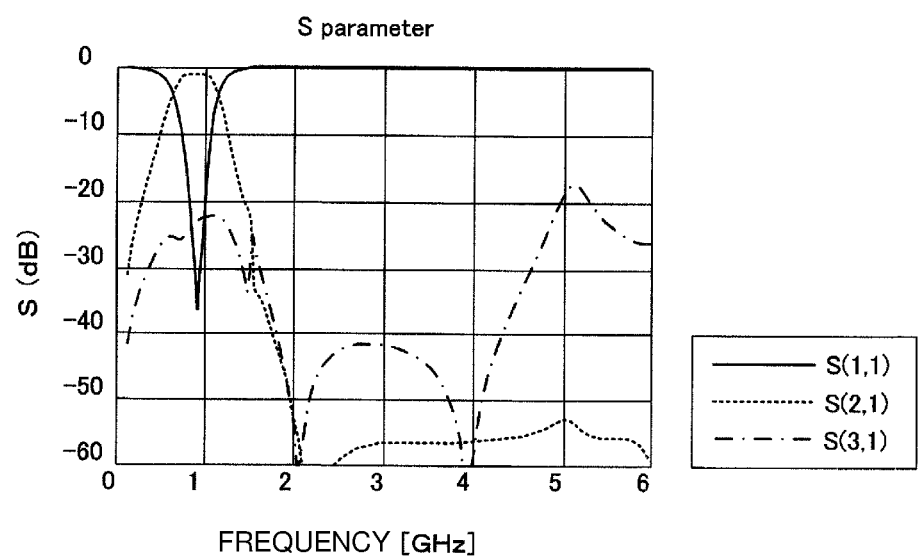
FIG. 4A is a frequency characteristics diagram of an area between an unbalanced terminal UB and a first balanced terminal Tx (Tx1 and Tx2) of the balance filter 100.
Figure 4B:
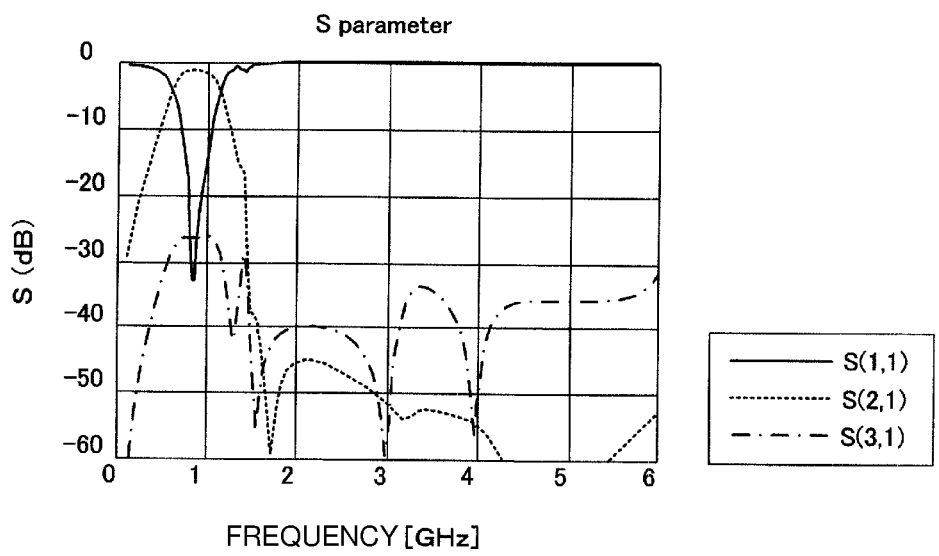
FIG. 4B is a frequency characteristics diagram of an area between the unbalanced terminal UB and a second balanced terminal Rx (Rx1 and Rx2) of the balance filter 100.

FIG. 4A illustrates frequency characteristics of an area between the unbalanced terminal UB and the first balanced terminal Tx (Tx1 and Tx2) of the balance filter 100. FIG. 4B illustrates frequency characteristics of an area between the unbalanced terminal UB and the second balanced terminal Rx (Rx1 and Rx2). As is clear from a comparison between FIGS. 4A and 4B, both of the frequency characteristics exhibit pass bands of the same or substantially the same frequency. Therefore, the balance filter 100 according to the present preferred embodiment is suitable to be used for communication in a TDD (Time Division Duplex) method. However, the frequency of a pass band between the first balanced terminal Tx (Tx1 and Tx2) and the unbalanced terminal UB is not necessary the same or substantially the same as the frequency of a pass band between the unbalanced terminal UB and the second balanced terminal Rx (Rx1 and Rx2). The frequencies of these pass bands may be different from each other.

Figure 5A:
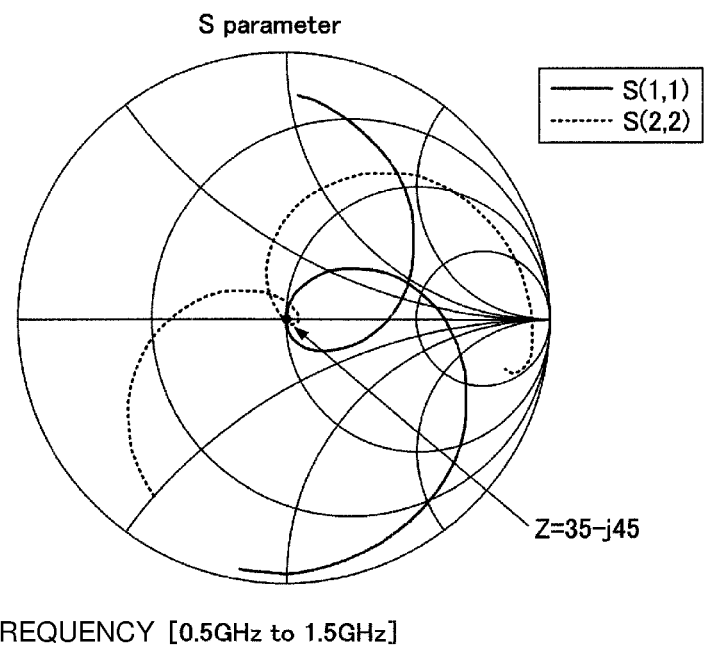
FIG. 5A is a Smith chart on the first balanced terminal Tx (Tx1 and Tx2) side of the balance filter 100.
Figure 5B:
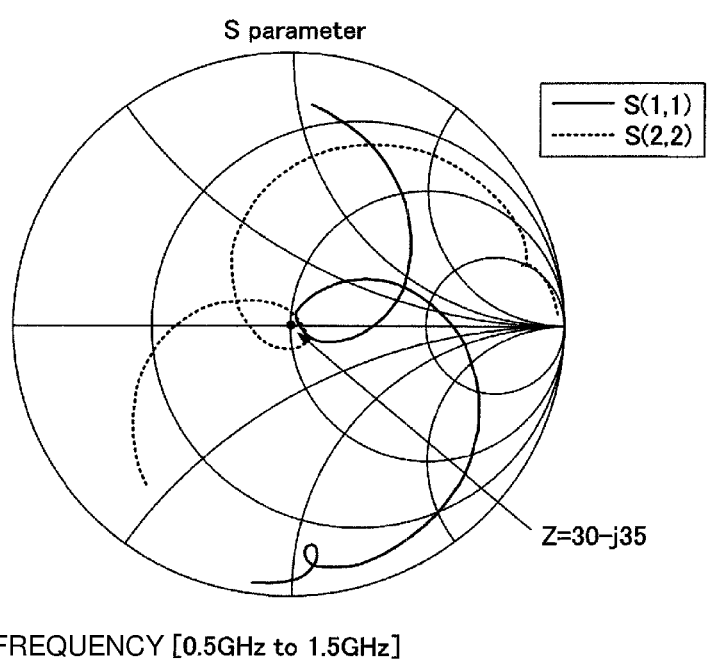
FIG. 5B is a Smith chart on the second balanced terminal Rx (Rx1 and Rx2) side of the balance filter 100.
Figure 6:
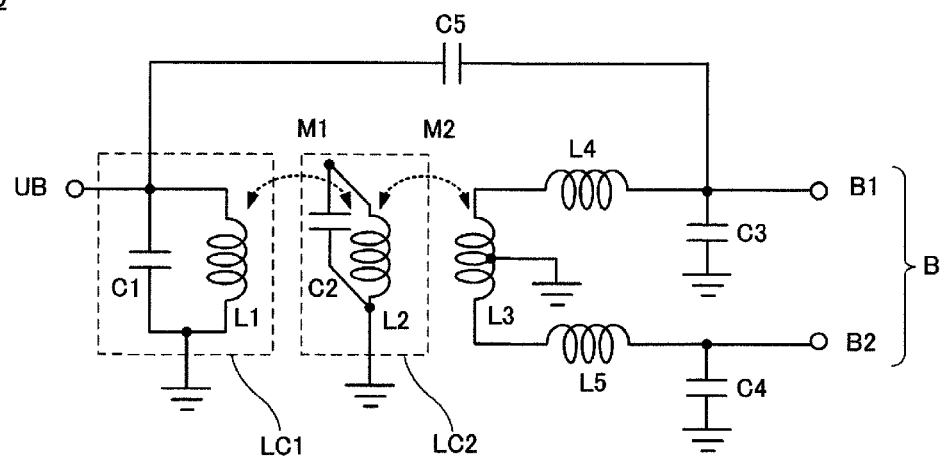
FIG. 6 is an equivalent circuit diagram illustrating a balance filter (laminated balance filter) 200 described in Japanese Unexamined Patent Application Publication No. 2013-138410.
Figure 7:
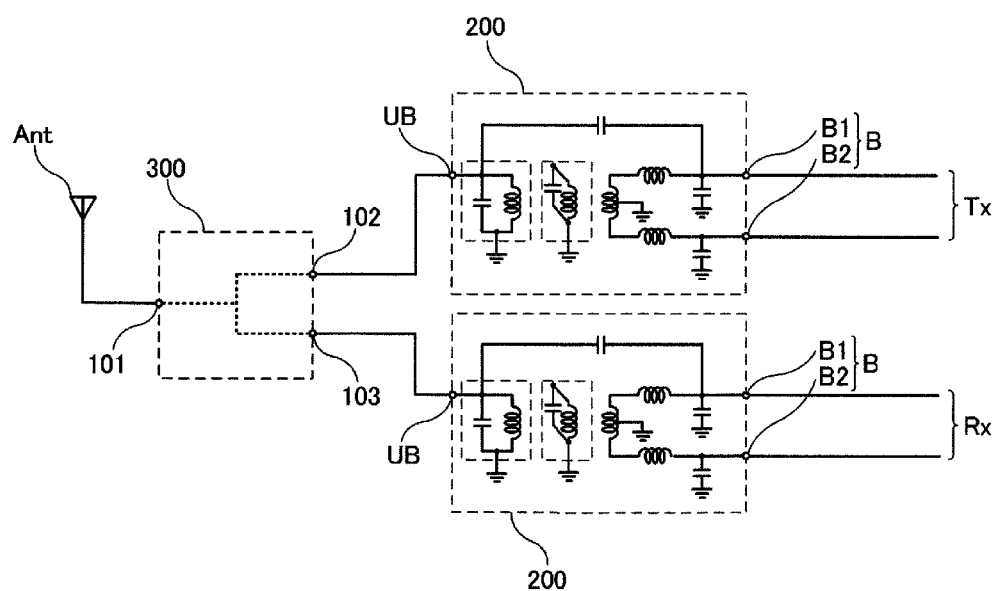
FIG. 7 is an equivalent circuit diagram illustrating an example of a balanced-unbalanced conversion circuit having a configuration in which a divider 300 is connected to two balance filters 200.

FIG. 5A illustrates a Smith chart on the first balanced terminal Tx (Tx1 and Tx2) side of the balance filter 100. FIG. 5B illustrates a Smith chart on the second balanced terminal Rx (Rx1 and Rx2) side. In the Smith chart illustrated in FIG. 5A, the value of a standardized impedance (center of the Smith chart) is set to about 35-j45. In the Smith chart illustrated in FIG. 5B, the value of a standardized impedance (center of the Smith chart) is set to about 30-j35. As is clear from FIGS. 5A and 5B, in both of the Smith charts, impedances are concentrated at the center, which is represented by a standardized impedance. Therefore, the first balanced terminal Tx and the second balanced terminal Rx exhibit different impedances.

The balance filter 100 according to a preferred embodiment of the present invention has been described above. However, the present invention is not limited to the contents described above, and various changes may be made to the present invention. For example, the balance filter 100 includes the multilayer body 1 in which the dielectric layers 1a to 1q are laminated. However, balance filters according to preferred embodiments of the present invention may be configured such that a discrete component is mounted on a substrate, instead of including the multilayer body 1.

For the sake of convenience, the balance filter 100 is configured such that a Tx terminal is used as a first balanced terminal and an Rx terminal is used as a second balanced terminal. However, as described above, a balance filter may be used in a desired manner, and the use of the balance filter is not limited to the manner of use described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A balance filter comprising:
an unbalanced terminal;
a first balanced terminal including a first terminal and a second terminal;
a second balanced terminal including a first terminal and a second terminal;
a multilayer body including a plurality of dielectric layers that are laminated;
a plurality of inductor electrodes that are laminated between the dielectric layers; and
a plurality of via electrodes that penetrate through the dielectric layers; wherein
an unbalanced-side inductor is provided between the unbalanced terminal and a ground;
a first balanced-side inductor is provided between the first terminal and the second terminal of the first balanced terminal and includes a first inductor unit, a second inductor unit, and a third inductor unit that are connected in series in order;
a second balanced-side inductor is provided between the first terminal and the second terminal of the second balanced terminal and includes a first inductor unit, a second inductor unit, and a third inductor unit that are connected in series in order;
the unbalanced-side inductor is electromagnetic-field-coupled to each of the first balanced-side inductor and the second balanced-side inductor;
each of the unbalanced-side inductor, the first balanced-side inductor, and the second balanced-side inductor is defined by at least one of the inductor electrodes, or by at least one of the inductor electrodes and at least one of the via electrodes;
inside the multilayer body, the at least one of the inductor electrodes defining the unbalanced-side inductor includes at least a lower inductor electrode and an upper inductor electrode; and
in a direction in which the dielectric layers are laminated, the at least one of the inductor electrodes defining the second inductor unit of the first balanced-side inductor and the at least one of the inductor electrodes defining the second inductor unit of the second balanced-side inductor are sandwiched between the lower inductor electrode and the upper inductor electrode of the unbalanced-side inductor.

2. The balance filter according to claim 1, wherein
a low pass filter is provided between the unbalanced terminal and the unbalanced-side inductor;
the low pass filter includes a first inductor, a first capacitor provided between one end of the first inductor and the ground, and a second capacitor provided between the other end of the first inductor and the ground; and
the unbalanced-side inductor is connected in parallel with the second capacitor.

3. The balance filter according to claim 2, wherein a third capacitor is connected in parallel with the first inductor of the low pass filter.

4. The balance filter according to claim 3, wherein
a fourth capacitor is provided between the first terminal and the second terminal of the first balanced terminal; and
a fifth capacitor is provided between the first terminal and the second terminal of the second balanced terminal.

5. The balance filter according to claim 1, wherein
the unbalanced-side inductor is electromagnetic-field-coupled primarily to the second inductor unit of the first balanced-side inductor;
the unbalanced-side inductor is electromagnetic-field-coupled primarily to the second inductor unit of the second balanced-side inductor.

6. The balance filter according to claim 1, wherein a DC feed terminal is connected to a middle portion of the first balanced-side inductor.

7. The balance filter according to claim 1, wherein an impedance of the first balanced terminal is different from an impedance of the second balanced terminal.

8. The balance filter according to claim 1, wherein a frequency of a pass band between the unbalanced terminal and the first balanced terminal is different from a frequency of a pass band between the unbalanced terminal and the second balanced terminal.

9. The balance filter according to claim 1, wherein a frequency of a pass band between the unbalanced terminal and the first balanced terminal is the same or substantially the same as a frequency of a pass band between the unbalanced terminal and the second balanced terminal.

10. The balance filter according to claim 4, further comprising:
a plurality of capacitor electrodes that are laminated between the dielectric layers; wherein
at least one of the first capacitor, the second capacitor, the third capacitor, the fourth capacitor, and the fifth capacitor is defined by a capacitance produced between the plurality of capacitor electrodes.

11. The balance filter according to claim 1, wherein
the lower inductor electrode and the upper inductor electrode are connected by one of the via electrodes.

12. The balance filter according to claim 11, wherein
each of the at least one of the inductor electrodes defining the first balanced-side inductor and the at least one of the inductor electrodes defining the second balanced-side inductor has a ring shape; and
the at least one of the via electrodes that provides connection between the lower inductor electrode and the upper inductor electrode of the unbalanced-side inductor penetrates through inside the ring shape of the at least one of the inductor electrodes of the second inductor unit of the first balanced-side inductor and inside the ring shape of the at least one of the inductor electrodes of the second inductor unit of the second balanced-side inductor.

13. The balance filter according to claim 2, wherein the low pass filter is a π low pass filter.

14. The balance filter according to claim 1, further comprising at least one floating terminal that is not connected to any circuit element inside the multilayer body.

15. The balance filter according to claim 1, wherein the unbalanced terminal and the first and second balanced terminals are made of Ag, Cu, or a metal including an alloy of Ag or Cu as a main component.

16. The balance filter according to claim 15, wherein the unbalanced terminal and the first and second balanced terminals include at least one plated layer including Ni, Sn, or Au as a main component.

17. The balance filter according to claim 1, wherein the inductor electrodes and the via electrodes are made of Ag, Cu, or a metal including an alloy of Ag or Cu as a main component.

* * * * *